US012198658B2

(12) United States Patent
Lee et al.

(10) Patent No.: US 12,198,658 B2
(45) Date of Patent: Jan. 14, 2025

(54) ELECTRONIC DEVICE FOR SYNCHRONIZING OUTPUT OF AUDIO AND VIDEO AND METHOD FOR CONTROLLING THE SAME

(71) Applicant: SAMSUNG ELECTRONICS CO., LTD., Suwon-si (KR)

(72) Inventors: Sangeun Lee, Suwon-si (KR); Heungseok Kang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/297,181

(22) Filed: Apr. 7, 2023

(65) Prior Publication Data
US 2024/0021174 A1    Jan. 18, 2024

Related U.S. Application Data

(63) Continuation of application No. PCT/KR2023/004050, filed on Mar. 27, 2023.

(30) Foreign Application Priority Data

Jul. 13, 2022  (KR) .................. 10-2022-0086137

(51) Int. Cl.
*G09G 5/12* (2006.01)
*G10L 21/055* (2013.01)
(Continued)

(52) U.S. Cl.
CPC .............. *G09G 5/12* (2013.01); *G10L 21/055* (2013.01); *H03K 19/21* (2013.01); *H04N 5/04* (2013.01)

(58) Field of Classification Search
CPC ......... H03K 19/21; G10L 21/055; G09G 5/12
See application file for complete search history.

(56) References Cited

U.S. PATENT DOCUMENTS 5,892,535 A * 4/1999 Allen ................. H04N 7/17318
348/E7.071
7,295,578 B1    11/2007 Lyle et al.
(Continued)

FOREIGN PATENT DOCUMENTS

CN    105959774 A    9/2016
CN    210327842       4/2020
(Continued)

OTHER PUBLICATIONS

Search Report and Written Opinion dated Jun. 22, 2023 issued in International Patent Application No. PCT/KR2023/004050.

*Primary Examiner* — Brian P Yenke
(74) *Attorney, Agent, or Firm* — Nixon & Vanderhye, P.C.

(57) ABSTRACT

An electronic device and a control method for synchronizing audio and video outputs are disclosed. The electronic device includes: at least one memory, at least one display component including display circuitry, at least one audio component including audio circuitry, and at least one processor electrically connected to at least some of the memory, the display component, and the audio component. The processor is electrically connected to a feedback circuitry and configured to transmit a first signal related to video and a second signal related to audio to the feedback circuitry. The processor is configured to obtain, based on a feedback signal received from the feedback circuitry, a time difference in between a first time point at which a voltage level of the first signal is switched, and a second time point at which a voltage level of the second signal is switched. The processor is configured to control an output timing of the audio or the video based on the time difference.

15 Claims, 7 Drawing Sheets

(51) Int. Cl.
*H03K 19/21* (2006.01)
*H04N 5/04* (2006.01)

(56) References Cited

U.S. PATENT DOCUMENTS

| | | | | |
|---|---|---|---|---|
| 7,623,186 | B2* | 11/2009 | Seong | H04N 5/44 |
| | | | | 455/566 |
| 7,692,724 | B2* | 4/2010 | Arora | G11B 27/10 |
| | | | | 348/473 |
| 8,117,330 | B2* | 2/2012 | Mukaide | H04L 65/1101 |
| | | | | 713/400 |
| 9,554,061 | B1* | 1/2017 | Proctor, Jr. | H04S 7/00 |
| 9,729,928 | B2 | 8/2017 | Kim et al. | |
| 9,742,964 | B2* | 8/2017 | Lee | H04N 21/43615 |
| 9,766,851 | B2 | 9/2017 | Liu et al. | |
| 2006/0195872 | A1* | 8/2006 | Seo | H04H 60/80 |
| | | | | 725/62 |
| 2007/0200964 | A1* | 8/2007 | Lee | H04N 21/426 |
| | | | | 348/E5.123 |
| 2007/0223874 | A1 | 9/2007 | Hentschel | |
| 2009/0225062 | A1* | 9/2009 | Naik | G09G 5/006 |
| | | | | 345/204 |
| 2013/0271656 | A1 | 10/2013 | Iwaki et al. | |
| 2014/0009625 | A1 | 1/2014 | Lee et al. | |
| 2014/0096251 | A1* | 4/2014 | Doctor | H04L 63/1441 |
| | | | | 726/23 |
| 2016/0134785 | A1 | 5/2016 | Greene | |
| 2017/0171612 | A1 | 6/2017 | Liu | |
| 2018/0095706 | A1* | 4/2018 | Chu | H04N 5/602 |
| 2020/0077134 | A1* | 3/2020 | White | H04N 21/439 |
| 2020/0310999 | A1* | 10/2020 | Jeong | H04R 3/00 |
| 2021/0006865 | A1 | 1/2021 | Yu et al. | |
| 2021/0127039 | A1* | 4/2021 | Uemura | H04N 21/4392 |
| 2021/0248980 | A1* | 8/2021 | Lee | G09G 5/18 |
| 2023/0156265 | A1* | 5/2023 | Park | H04N 21/4307 |
| | | | | 700/94 |
| 2023/0421946 | A1* | 12/2023 | Park | G06F 3/165 |

FOREIGN PATENT DOCUMENTS

| | | |
|---|---|---|
| JP | 2009-206673 | 10/2013 |
| JP | 2013-223091 | 10/2013 |
| KR | 19980027646 A | 7/1998 |
| KR | 10-0617105 | 8/2006 |
| KR | 10-2007-0034462 | 3/2007 |
| KR | 100802133 B1 | 2/2008 |
| KR | 101103150 B1 | 1/2012 |
| KR | 10-2014-0004991 | 1/2014 |
| KR | 10-2022-0089273 | 6/2022 |
| WO | 2005/099251 | 10/2005 |
| WO | 2017/045446 | 3/2017 |

* cited by examiner

ELECTRONIC DEVICE FOR SYNCHRONIZING OUTPUT OF AUDIO AND VIDEO AND METHOD FOR CONTROLLING THE SAME

CROSS REFERENCE TO RELATED APPLICATIONS

This application is a continuation of International Application No. PCT/KR2023/004050 designating the United States, filed on Mar. 27, 2023, in the Korean Intellectual Property Receiving Office, which claims priority to Korean Patent Application No. filed on Jul. 13, 2022, in the Korean Intellectual Property Office, the disclosures of which are incorporated by reference herein in their entireties.

BACKGROUND

Field

The disclosure relates to an electronic device for synchronizing outputs of audio and video and a method for controlling the same

Description of Related Art

An audio/video system provides a user with multimedia contents. This audio/video system may obtain video data and audio data separately and output their synchronized video data and audio data. Meanwhile, the audio/video systems may often use various types of video processing, such as e.g., MPEG decoding, which may cause processing delays in its video signal transmission path. Thus, similar delays required to be also reflected in the audio signal transmission path so as to synchronize the audio signal path to the video signal path.

SUMMARY

Embodiments of the disclosure provide an electronic device for automatically synchronizing audio and video outputs and a control method thereof.

According to an example embodiment, an electronic device for synchronizing audio and video outputs is provided. The electronic device comprises: at least one memory; at least one display component including a display; at least one audio component including audio circuitry; and at least one processor electrically connected to at least some of the memory, the display component, and the audio component. According to an example embodiment, the at least one processor is electrically connected to feedback circuitry and configured to transmit a first signal related to video and a second signal related to audio to the feedback circuitry. According to an example embodiment, the at least one processor is configured to: obtain, based on a feedback signal received from the feedback circuitry, a time difference in between a first time point at which a voltage level of the first signal is switched, and a second time point at which a voltage level of the second signal is switched; and control an output timing of the audio or the video based on the time difference.

According to an example embodiment, the feedback circuitry includes an XOR gate electrically connected to one or more general purpose input/output (GPIO) ports of the processor.

According to an example embodiment, the first signal is transmitted to the feedback circuitry through a first GPIO port, the second signal is transmitted to the feedback circuitry through a second GPIO port, and the feedback signal is received from the feedback circuitry through a third GPIO port.

According to an example embodiment, a voltage level of the feedback signal is determined based on voltage levels of the first signal and the second signal.

According to an example embodiment, the voltage level of the feedback signal is switched at a first time point based on a voltage level of the first signal being switched and at a second time point based on the voltage level of the second signal being switched.

According to an example embodiment, the voltage level of the first signal is switched by at least one processor at a time point at which a video signal is decoded or at a time point at which the video signal is transmitted to a timing controller or a display component.

According to an example embodiment, the voltage level of the second signal is switched by at least one processor at a time point at which an audio signal is decoded or at a time point at which the audio signal is transmitted to a sound amplifier or an audio component.

According to an example embodiment, the time difference includes a first delay time between time points based on a video signal and an audio signal being decoded, and a second delay time between time points based on the video signal and the audio signal being transmitted to another system component.

According to an example embodiment, the at least one processor is configured to: control an output timing of audio or video so that based on at least one of the first delay time and the second delay time being out of a specified threshold range, at least one of the first delay time and the second delay time is identified within the threshold range.

According to an example embodiment, the at least one processor is configured to control the output timing of audio or video so that based on the second delay time being out of a specified threshold range, at least one of the first delay time and the second delay time is identified within the threshold range.

According to an example embodiment, an electronic device for synchronizing audio and video outputs is provided. The electronic device comprises: at least one display component including a display and a timing controller electrically connected to the at least one display component; at least one audio component including audio circuitry and a sound amplifier electrically connected to the at least one audio component; and processing circuitry electrically connected to at least some of the timing controller and the sound amplifier. According to an example embodiment, the processing circuitry includes a first GPIO port electrically connected to a feedback circuitry and configured to transmit a first signal related to video to the feedback circuitry, a second GPIO port electrically connected to the feedback circuitry and configured to transmit a second signal related to audio to the feedback circuitry, and a third GPIO port configured to receive a feedback signal from the feedback circuitry.

According to an example embodiment, the processing circuitry is configured to obtain a time difference between a first time point based on the voltage level of the first signal being switched and a second time point based on the voltage level of the second signal being switched, based on the feedback signal received from the feedback circuitry.

According to an example embodiment, the processing circuitry is configured to control an output timing of the audio or the video based on the time difference.

According to an example embodiment, the voltage level of the first signal is switched by the at least one processing circuitry at a time point when a video signal is decoded or at a time point when the video signal is transmitted to the timing controller or the display component.

According to an example embodiment, the voltage level of the second signal is configured to be switched by at least one processing circuitry at a time point at which an audio signal is decoded or at a time point at which the audio signal is transmitted to the sound amplifier or the audio component.

According to an example embodiment, the feedback circuitry include an XOR gate electrically connected to the first to third GPIO ports.

According to an example embodiment, a control method of an electronic device for synchronizing audio and video outputs is provided. The method comprises: transmitting, by at least one processor, a first signal related to video and a second signal related to audio to a feedback circuitry, obtaining a time difference in between a first time point at which a voltage level of the first signal is switched and a second time point at which a voltage level of the second signal is switched, based on a feedback signal received from the feedback circuitry unit, and controlling an output timing of the audio or the video based on the time difference.

A non-transitory computer readable recording medium (CRM) according to an embodiment stores one or more instructions, which instructions when executed by at least one processor provided in an electronic device or another electronic device coupled to the electronic device, and the one or more instructions cause the electronic device to perform each operation of the control method.

The electronic device according to an example embodiment of the disclosure can automatically control the output timing of audio or video so that a delay between audio and video outputs can be minimized and/or reduced even if it is not fine-tuned according to a user input.

The electronic device according to an example embodiment can control the decoding timing of audio and video so that such a delay is minimized and/or reduced.

The electronic device according to an example embodiment makes it possible to, when it is identified a delay between audio and video, that is, a so-called lip-sync problem, display a message window informing a user of the lip-sync problem on a display so as to address the lip-sync problem based on a user intention.

The effects that can be obtained in the various example embodiments of the disclosure are not limited to those described above, and any other effects not mentioned herein will be clearly derived and understood by those having ordinary knowledge in the technical field to which the various example embodiments of the disclosure belong, from the description below.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

The following description is made with reference to the accompanying drawings, wherein various examples for implementing the disclosure are illustrated only as examples in the drawings. Further, other examples may be used and structural modifications may be made without departing from the scope of various examples.

DETAILED DESCRIPTION

Hereinafter, with reference to the drawings, various example embodiments of the present disclosure will be described in greater detail. However, the disclosure may be implemented in several different forms and is not limited to the example embodiments described herein. In conjunction with the description of the drawings, like or similar reference numerals may be used for like or similar components. Further, in the drawings and their related descriptions, descriptions of well-known functions and configurations may be omitted for clarity and conciseness.

Figure 1:
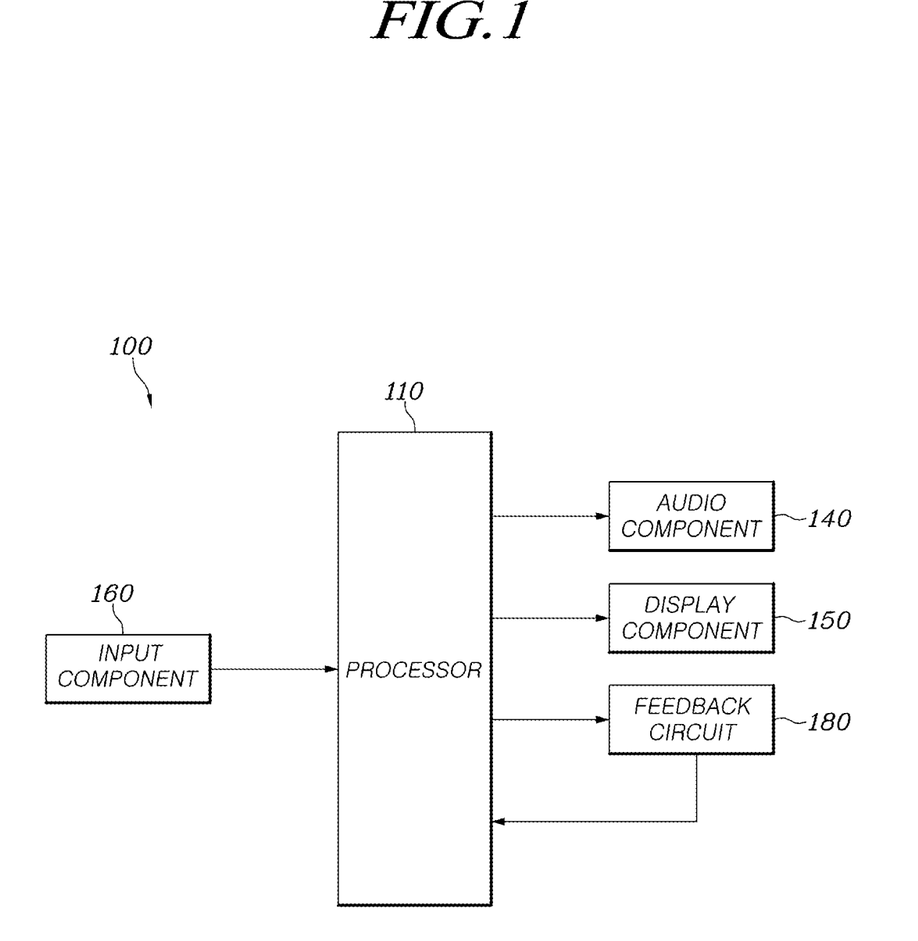
FIGS. 1 and 2 are block diagrams illustrating example configurations of an electronic device according to various embodiments.

FIG. 1 is a block diagram illustrating an example configuration of an electronic device according to various embodiments.

According to an embodiment of the disclosure, an electronic device 100 may include at least some of an input component (e.g., including input circuitry) 160, a processor (e.g., including processing circuitry) 110, an audio component (e.g., including audio circuitry) 140, a display component (e.g., including a display) 150, and feedback circuit 180.

According to an embodiment, the audio component 140 may include an audio circuitry for driving the same. In an embodiment, the display component 150 may include a display circuitry to drive the same. The audio circuitry and/or the display circuitry may be electrically connected with the processor.

According to an embodiment, at least one input component 160 may include various input circuitry to provide audio or video (A/V) signals of an external device to the processor 110. The processor 110 may process the received external A/V signal to transmit the same to another system component. The system component receiving the A/V signal may include, for example, the processor 110, the audio component 140, the display component 150, or the feedback circuitry 180, but the disclosure is not limited thereto.

In an embodiment, the A/V signal may include an audio signal, a video signal, or a combination thereof.

According to an embodiment, the audio signal and the video signal may be input through different input components 160. In an embodiment, the audio signal may be input through a first input unit and the video signal may be input through a second input unit. In an embodiment, the first input unit and the second input unit may be electrically connected to the processor 110 as independent components. Meanwhile, in an embodiment, the A/V signal may be input through one input component 160.

According to an embodiment, the processor 110 may be electrically connected to the audio component 140 and/or the display component 150. The processor 110 may pre-process the A/V signal received from the input component 160 to transmit it to the audio component 140 or may transmit the received A/V signal to the audio component 140. The processor 110 may pre-process the A/V signal received from the input component 160 to transmit it to the display component 150 or may transmit the received A/V signal to the display component 150.

According to an embodiment, one or more processors 110 may include a controller. In an embodiment, the controller may, for example, and without limitation, include a set of at least some of various processors such as e.g., a communication control processor, an application processor, a graphic processor, a memory control processor, and/or a MICOM. In an embodiment, the one or more processors 110 may include a main controller and a timing controller, and the corresponding controller(s) will be described in greater detail below with reference to FIG. 2.

According to an embodiment, the processor 110 may obtain one or more GPIO signals based on the signals being provided to other system components (e.g., an audio component 140, a display component 150, a transceiver, or the like).

According to an embodiment, the processor 110 may obtain a first GPIO signal based on the audio signal being provided to another system component. In an embodiment, the processor 110 may obtain a second GPIO signal based on the video signal being provided to another system component.

According to an embodiment, at least one of the first GPIO signal and the second GPIO signal may be generated based on a response signal received from at least some of the system components such as the audio component 140, the display component 150, or the transceiver.

According to an embodiment, the processor 110 may not only transmit an A/V signal to the audio component 140 and/or the display component 150, but also receive a response signal related to transmission of the A/V signal from the circuitry of the audio component 140 and/or the circuitry of the display component 150.

According to an embodiment, the response signal may be used for synchronization between the video signal and the audio signal. In an embodiment, the response signal may be used to indicate or identify a delay between output timing points of the video signal and the audio signal.

According to an embodiment, the first and second GPIO signals may be provided to the feedback circuitry 180 applied to an embodiment of the disclosure through at least one GPIO port. In an embodiment, the GPIO port may be configured as at least part of the processor 110 or configured to be electrically coupled with the processor 110. In an embodiment, the GPIO port may be configured as a pin-type terminal provided in the processor 110. In an embodiment, the GPIO port may include at least some of the electrical terminals of the processing circuitry.

According to an embodiment, the feedback circuitry 180 may include or be configured of one or more XOR gates. In an embodiment, the feedback circuitry 180 may be electrically connected to the processor 110 (or processing circuitry). In an embodiment, the feedback circuitry 180 may transmit and receive an electrical signal to and from the processor 110 through one or more GPIO ports. In an embodiment, the feedback circuitry 180 may receive the first GPIO signal through a first GPIO port and receive the second GPIO signal through a second GPIO port. The first GPIO signal and the second GPIO signal may be distinguished based on attributes of a source signal (e.g., source audio data, source video data). The first GPIO signal may be a GPIO signal related to audio, and the second GPIO signal may be a GPIO signal related to video.

According to an embodiment, first and second terminals of the XOR gate are input terminals, wherein the first GPIO signal may be input through the first terminal and the second GPIO signal may be input through the second terminal. In an embodiment, a third terminal of the XOR gate is an output terminal and is electrically connected to the processor 110 to transmit a result of logic operation of the XOR gate to the processor 110.

According to an embodiment, the first GPIO signal and the second GPIO signal may be provided with either one of a high level or a low level. In an embodiment, a voltage value at a high level and a voltage value at a low level of each of the first GPIO signal and the second GPIO signal may be either the same as or different from each other, but are not limited thereto.

According to an embodiment, when the input voltage levels (high level or low level) of the first GPIO signal and the second GPIO signal are different from each other, the feedback circuitry 180 may output a first level of feedback signal. In an embodiment, when the input voltage levels of the first GPIO signal and the second GPIO signal are the same, the feedback circuitry 180 may output a second level of feedback signal. The first level and the second level may be either a high level or a low level, respectively, and the first level and the second level have different voltage levels. For example, if the first level is of a high level, the second level may be implemented as a low level. Further, for example, if the first level is a low level, the second level may be implemented as a high level.

According to an embodiment, the processor 110 may identify a time duration for which voltage levels of the first GPIO signal and the second GPIO signal are maintained to be different. In an embodiment, the feedback circuitry 180 provides a first level of feedback signal (first feedback signal) to the processor 110 while maintaining different voltage levels of the first GPIO signal and the second GPIO signal. In an embodiment, while the voltage levels of the first GPIO signal and the second GPIO signal are kept the same, the feedback circuitry 180 provides a second level of feedback signal (second feedback signal) to the processor 110.

According to an embodiment, the processor 110 may identify a time duration from when the first feedback signal is received until the second feedback signal is received. A time from when the first feedback signal is received until the second feedback signal is received may cause a delay in between audio and video outputs.

According to an embodiment, the processor 110 may control an output timing or a decoding timing for the audio signal or the video signal, or both of them, when the time duration from the time the first feedback signal is received until the time the second feedback signal is received is out of a preset threshold range.

According to an embodiment, when the time duration from the time the first feedback signal is received to the time the second feedback signal is received is within a preset threshold range, the processor 110 may maintain the output timing or the decoding timing for the audio signal, the video signal, or both of them in its current condition.

According to an embodiment, the threshold range may be set to a range from a predetermined negative time value to a predetermined positive time value. For example, the threshold range may be set to −100 ms to 600 ms, but is not limited thereto.

According to an embodiment, the threshold range may be changed based on user settings. The user settings may be created or changed based on a user input to the electronic device. The user input may be obtained based on a command received from an input device configured as at least a part of the electronic device (e.g., a hard key, a touch screen, etc.)

or an external device capable of communicating with the device by wire or wirelessly (e.g., STB, remote controller, or the like).

Further, according to an embodiment, the threshold range may be set to a predetermined (e.g., specified) threshold value. The threshold value may be set to a positive absolute value. In the case of an embodiment in which a certain threshold value is applied, at least one processor 110 may compare an absolute value for a time value identified based on the first feedback signal and the second feedback signal with the threshold value. In an embodiment, when the absolute value of the identified time is greater than a predetermined threshold value, the at least one processor 110 may control the output timing or the decoding timing for the audio signal, the video signal, or both of them until the absolute value of the identified time is less than the threshold value.

Figure 2:
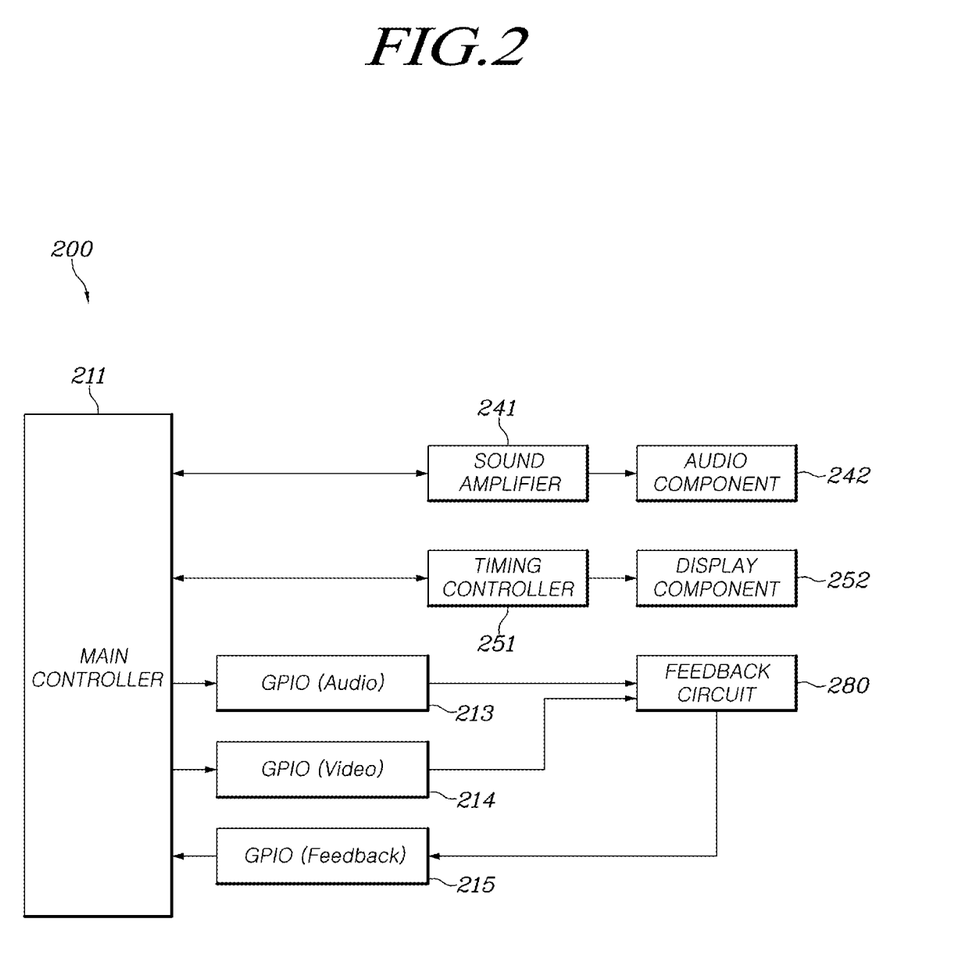

FIG. 2 is a block diagram illustrating an example configuration of an electronic device according to various embodiments.

According to an embodiment of the disclosure, the electronic device 200 may include or be configured of at least some of a main controller (e.g., including control and/or processing circuitry) 211, a plurality of GPIO ports 213, 214, 215, a sound amplifier 241, an audio component (e.g., including audio circuitry) 242, a timing controller (e.g., including timing control circuitry) 251, a display component (e.g., including display circuitry) 252 and/or a feedback circuitry 280.

According to an embodiment, the controller may be configured of at least one processor, or a set of processors. In an embodiment, the controller may include a main controller 211 and a timing controller 251. In an embodiment, the main controller 211 may control other electrically connected system components. In an embodiment, the main controller 211 may control the display component 252 included in the electronic device 200, by controlling the timing controller 251 electrically connected thereto.

According to an embodiment, the main controller 211 may control one or more system components electrically connected to drive the electronic device. In an embodiment, the main controller 211 may be electrically connected to a plurality of GPIO ports 213, 214, 215, the timing controller 251, and the sound amplifier 241. In an embodiment, the main controller 211 may be electrically connected to the audio component 242, the display component 252 and the feedback circuitry 280.

According to an embodiment, the main controller 211 may provide an electrical signal to the feedback circuitry 280 via the first GPIO port 213 related to audio and the second GPIO port 214 related to video. In an embodiment, the main controller 211 may receive an electrical signal (e.g., a feedback signal) from the feedback circuitry 280 through a third GPIO port 215.

According to an embodiment, the first GPIO port 213 and the second GPIO port 214 may transmit the first GPIO signal and the second GPIO signal to the feedback circuitry 280, respectively. In an embodiment, the third GPIO port 215 may receive the third GPIO signal from the feedback circuitry 280. Throughout the disclosure, the third GPIO signal may be referred to as a feedback signal. In the disclosure, the feedback signal may include a first feedback signal and a second feedback signal. The first feedback signal and the second feedback signal may be implemented to have different voltage levels.

According to an embodiment, the main controller 211 may transmit and receive signals, data, or information to/from other system components (e.g., a sound amplifier 241, a transceiver (not shown), a timing controller 251, or the like). In an embodiment, the main controller 211 may transmit audio signals or video signals to other system components.

According to an embodiment, the main controller 211 may switch a voltage level of at least one of the first GPIO signal and the second GPIO signal, in response to transmitting the audio signal and/or the video signal to other system component.

According to an embodiment, the main controller 211 may switch the voltage level of the first GPIO signal in response to transmitting the audio signal to other system component. According to an embodiment, the main controller 211 may switch the voltage level of the second GPIO signal in response to transmitting the video signal to other system components.

According to an embodiment, at least one of the first GPIO signal and the second GPIO signal may be generated based on a response signal received from other system component. In the disclosure, the response signal is referred to as a signal transmitted to the main controller 211 by other system component receiving a control signal, based on the main controller 211 transmitting the control signal to other system component (e.g., the sound amplifying unit 241 or the timing controller 251).

According to an embodiment, the response signal may be classified into a first response signal and a second response signal according to a type of the system component. For example, the response signal received from the sound amplifier 241 may be classified as a first response signal, and the response signal received from the timing controller 251 may be classified as a second response signal.

According to an embodiment, the response signal may be used for synchronization between a video signal and an audio signal. In an embodiment, the response signal may be used to indicate or identify a delay between output timing points of the video signal and the audio signal.

According to an embodiment, the main controller 211 may identify a delay in between the audio signal and the video signal, using the first response signal received from the sound amplifier 241 and the second response signal received from the timing controller 251. Hereinafter, description will be made of an operation of obtaining or generating a GPIO signal based on the response signal(s).

According to an embodiment, the main controller 211 may transmit and receive electrical signals to and from the sound amplifier 241. In an embodiment, the main controller 211 may be connected to the sound amplifier 241 through a system interface such as I2S. The main controller 211 may control the sound amplifier 241 based on the I2S interface. The main controller 211 may transmit, for example, Left Right Clock (LRRCK), Bit Clock (BCLK), and Serial Data (SDATA) to the sound amplifier 241.

According to an embodiment, the sound amplifier 241 may be electrically connected to the audio component 242 (e.g., a speaker). The sound amplifier 241 may perform an operation for amplifying an audio signal. The signal amplified by the sound amplifier 241 may be output through the audio component 242. In an embodiment, the sound amplifier 241 may be configured to be incorporated as at least a part of the audio component 242. In an embodiment, the sound amplifier 241 may be incorporated as at least a part of the main controller 211. In an embodiment, the main controller 211 and the sound amplifier 241 may integrally form a single SoC.

According to an embodiment, the sound amplifier 241 may transmit a response signal to the main controller 211 at the same time as, immediately after, or immediately before transmitting the amplified signal to the audio component 242. In an embodiment, the main controller 211 may control the voltage level of the first GPIO signal, based on the response signal received from the sound amplifier 241. In an embodiment, the main controller 211 may switch the voltage level of the first GPIO signal from a high level to a low level or from a low level to a high level, based on the response signal.

According to an embodiment, the main controller 211 may transmit and receive electrical signals to and from the timing controller 251.

According to an embodiment, the main controller 211 may be connected to the timing controller 251 through a system interface such as Vx1. The main controller 211 may control the timing controller 251 based on the Vx1 interface.

According to an embodiment, the timing controller 251 may transmit an electrical signal to control the operation of the display component 252. For example, the timing controller 251 may generate clock signals for controlling operation timings of display drivers (e.g., source driver and/or gate driver) of a display panel. The timing controller 251 may transmit the clock signals to the aforementioned source driver and gate driver. The display component 252 (e.g., a display panel) may output image data based on a signal received from the timing controller 251.

According to an embodiment, the timing controller 251 may be configured to be incorporated as at least a part of the display component 252. In an embodiment, the timing controller 251 may be incorporated as at least a part of the main controller 211. In an embodiment, the main controller 211 and the timing controller 251 may integrally configure one processor (e.g., the processor 110 of FIG. 1).

According to an embodiment, the timing controller 251 may transmit a response signal to the main controller 211 at the same time as, immediately after, or immediately before transmitting the control signal to the display component 252. In an embodiment, the main controller 211 may control the voltage level of the second GPIO signal, based on the response signal received from the timing controller 251. In an embodiment, the main controller 211 may switch the voltage level of the second GPIO signal from a high level to a low level or from a low level to a high level, based on the response signal.

According to an embodiment of the disclosure, the electronic device may communicate with an external device through one or more transceivers (not shown). In an embodiment, the main controller 211 may include a transceiver as at least a part thereof or be electrically connected to the transceiver.

According to an embodiment, the main controller 211 may control the first GPIO signal in response to transmitting an audio signal or a video signal to an external device. In an embodiment, the main controller 211 may switch the voltage level of the first GPIO signal in response to transmitting the audio signal to an external device. In an embodiment, the main controller 211 may switch the voltage level of the first GPIO signal in response to transmitting the video signal to an external device.

According to an embodiment, the main controller 211 may control the second GPIO signal in response to receiving an audio signal or a video signal from an external device. In an embodiment, the main controller 211 may switch the voltage level of the second GPIO signal in response to receiving the audio signal from an external device. In an embodiment, the main controller 211 may switch the voltage level of the second GPIO signal in response to receiving the video signal from an external device.

According to an embodiment, the main controller 211 may control the first GPIO signal and the second GPIO signal in response to receiving a response signal from an external device. In an embodiment, the main controller 211 may switch the voltage level of the first GPIO signal in response to receiving a first response signal from an external device. In an embodiment, the main controller 211 may switch the voltage level of the second GPIO signal in response to receiving a second response signal from the external device.

According to an embodiment, the first and second GPIO signals may be provided to the feedback circuitry 280 applied to an embodiment of the present disclosure through at least one GPIO port. In an embodiment, the at least one GPIO port may be configured as at least a part of the main controller 211 or electrically coupled with the main controller 211. In an embodiment, the at least one GPIO port may be configured as a pin-type terminal provided in the main controller 211. In an embodiment, the at least one GPIO port may be configured of at least some electrical terminals of the main controller 211 circuitry.

According to an embodiment, the feedback circuitry 280 may include one or more XOR gates. In an embodiment, the feedback circuitry 280 may be electrically connected to the main controller 211 (or a processing circuitry). In an embodiment, the feedback circuitry 280 may transmit and receive electrical signals to and from the main controller 211 through one or more GPIO ports. In an embodiment, the feedback circuitry 280 may receive the first GPIO signal through the first GPIO port 213 and receive the second GPIO signal through the second GPIO port 214. The first GPIO signal and the second GPIO signal may be distinguished based on properties of the source signals (e.g., a source audio signal, a source video signal, or the like). The first GPIO signal may be a GPIO signal related to audio, and the second GPIO signal may be a GPIO signal related to video.

According to an embodiment, the first and second terminals of the XOR gate are input terminals, and the first GPIO signal may be input through its first terminal and the second GPIO signal may be input through its second terminal. In an embodiment, a third terminal of the XOR gate is an output terminal and may be electrically connected to the main controller 211 to transmit a result of logic operation of the XOR gate to the main controller 211.

According to an embodiment, the first GPIO signal and the second GPIO signal may be provided at a high level or at a low level. In an embodiment, a voltage value at a high level and a voltage value at a low level of each of the first GPIO signal and the second GPIO signal may be the same as or different from each other, and the disclosure is not limited thereto.

According to an embodiment, when the voltage levels (high level or low level) of the input first GPIO signal and the input second GPIO signal are different from each other, the feedback circuitry 280 may output a first level of feedback signal. In an embodiment, when the input voltage levels of the first GPIO signal and the second GPIO signal are the same, the feedback circuitry 280 may output a second level of feedback signal. Here, the first level and the second level may be either a high level or a low level, respectively, and the first level and the second level have different voltage levels. For example, if the first level is a high level, the second level may be implemented as a low level. Further, for example, if the first level is a low level, the second level may be implemented as a high level.

According to an embodiment, the main controller 211 may identify a time during which the voltage levels of the first GPIO signal and the second GPIO signal are maintained to be different. In an embodiment, while the voltage levels of the first GPIO first GPIO signal and the second GPIO signal are maintained to be different, the feedback circuitry 280 transmits a first level of feedback signal (first feedback signal) to the main controller 211. In an embodiment, while the voltage level is kept the same, the feedback circuitry 280 provides a second level of feedback signal (second feedback signal) to the main controller 211.

According to an embodiment, the main controller 211 may identify a time duration from when the first feedback signal is received to when the second feedback signal is received. The time duration from when the first feedback signal is received to when the second feedback signal is received may cause a delay between audio and video.

According to an embodiment, when the time duration from the time the first feedback signal is received to the time the second feedback signal is received is out of a preset threshold range, the main controller 211 may control an output timing or a decoding timing for the audio signal, the video signal, or both of them.

According to an embodiment, when the time duration from the time the first feedback signal is received to the time the second feedback signal is received is within a preset threshold range, the main controller 211 may maintain the output timing or the decoding timing for the audio signal, the video signal, or both of them in the current condition.

According to an embodiment, the threshold range may be changed based on user settings. The user settings may be created or changed based on a user input to the electronic device. The user input may be obtained based on a command received from an input device configured as at least a part of the electronic device (e.g., a hard key, a touch screen, etc.) or an external device (e.g., STB, remote controller, etc.) capable of communicating with the device by wire or wirelessly.

Further, according to an embodiment, the threshold range may be set to a predetermined threshold value. The threshold value may be set to a positive absolute value. In the case of an embodiment in which a threshold value is applied, the main controller 211 may compare an absolute value for a time value identified based on the first feedback signal and the second feedback signal with the threshold value. In an embodiment, if the absolute time value is greater than a predetermined threshold value, then the main controller 211 may control an output timing or a decoding timing for an audio signal, a video signal, or both of them until the absolute value of the identified time value becomes less than the threshold value.

In the disclosure, referring to the waveform diagrams of FIGS. 3, 4 and 5, detailed description will be made of an operation of the processor of FIG. 2 and the main controller of FIG. 3 identifying a delay of the audio/video signals based on the first GPIO signal and the second GPIO signal and controlling the delay to be minimized and/or reduced. Here, the terms 'processor' and 'main controller' used in the following disclosure may be used interchangeably.

According to an embodiment, as output from the processor, the first GPIO signal represents a GPIO signal related to audio and the second GPIO signal represents a GPIO signal related to video. Throughout the disclosure, the first GPIO signal may be referred to as "GPIO (Audio)" and the second GPIO signal may be referred to as "GPIO (Video)".

Further, as the first GPIO signal and the second GPIO signal are input, the feedback circuitry may output a third GPIO signal. In the present disclosure, the third GPIO signal may be referred to as "GPIO (Feedback)". In an embodiment, the third GPIO signal may be referred to as a first feedback signal and a second feedback signal. The first feedback signal is a feedback signal having a first level of voltage, and the second feedback signal is a feedback signal having a second level of voltage.

According to an embodiment, the feedback circuitry may output either one of the first feedback signal and the second feedback signal, based on the voltage level of each of the first GPIO signal and the second GPIO signal.

Figure 3:
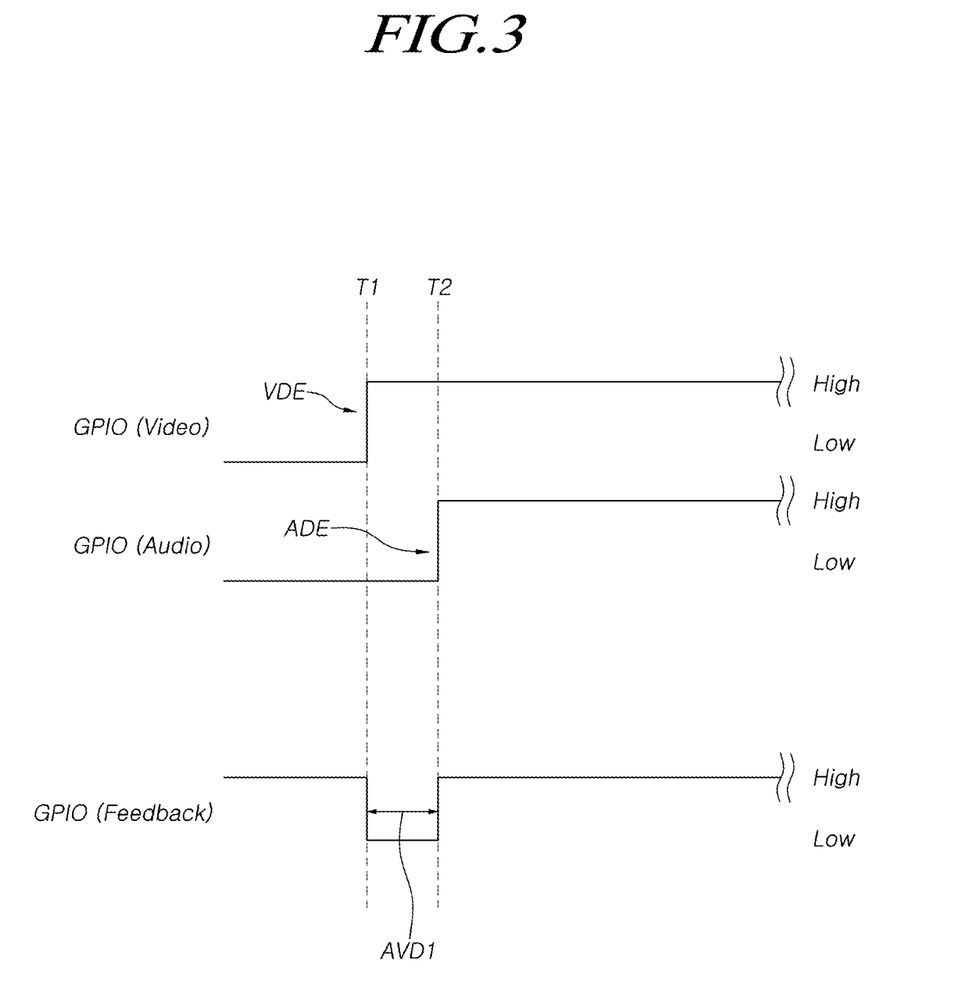
FIGS. 3, 4 and 5 are waveform diagrams of various signals according to various embodiments.
Figure 4:
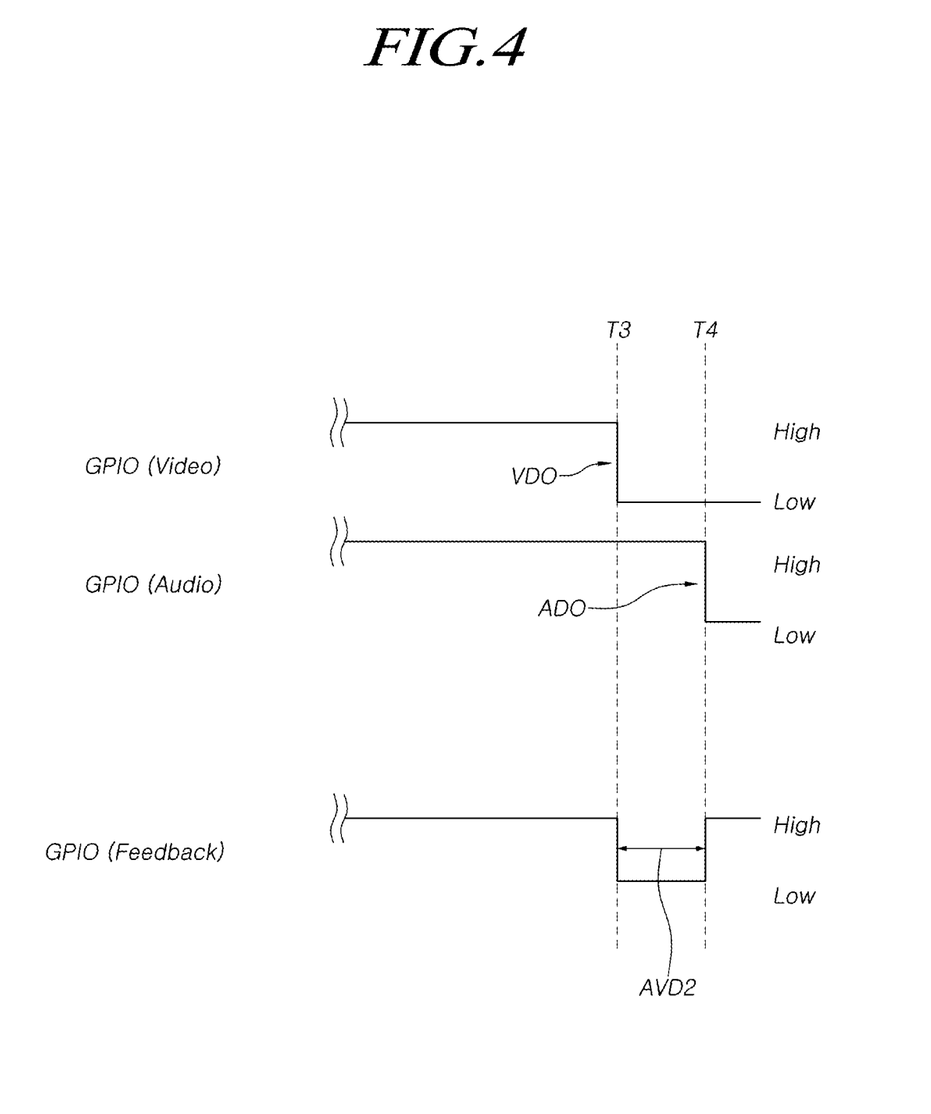
Figure 5:
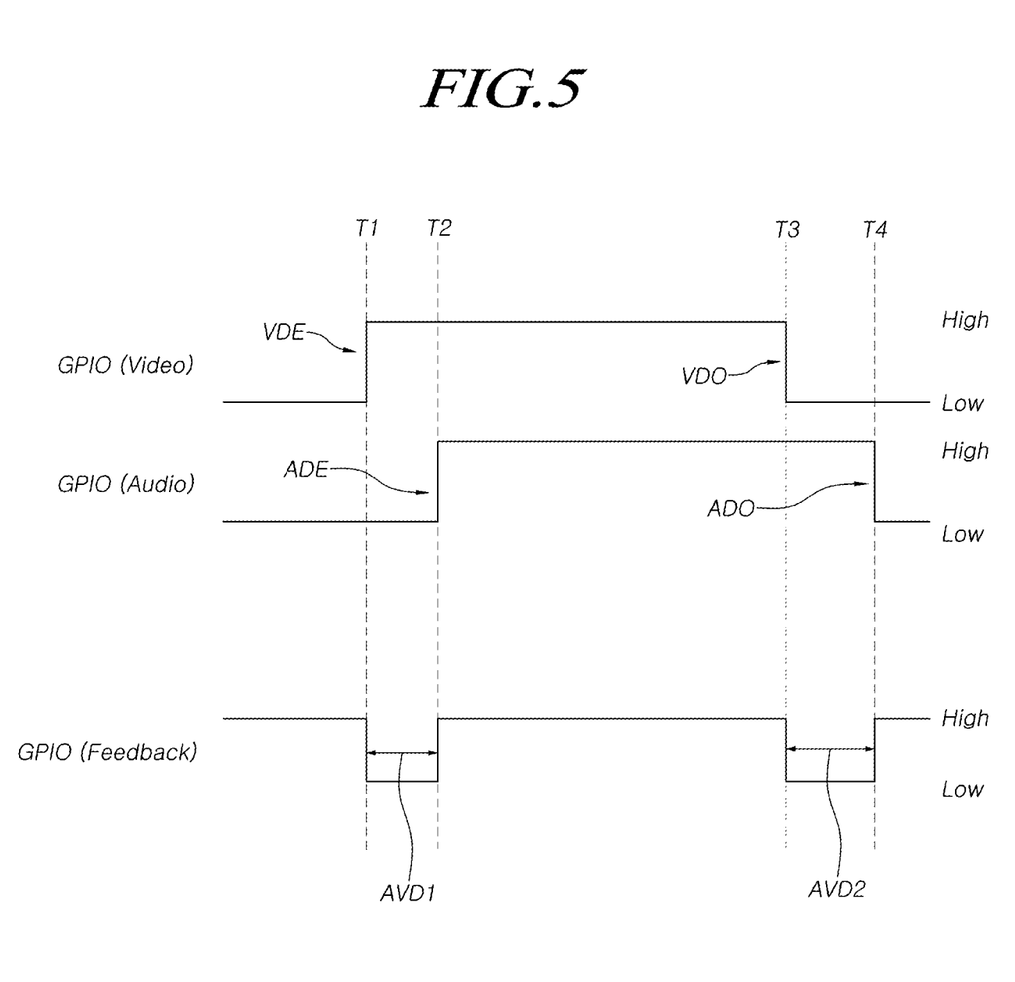

FIGS. 3, 4 and 5 are waveform diagrams of various signals according to various embodiments.

According to an embodiment, the voltage levels of the first GPIO signal and the second GPIO signal may be switched in response to data being decoded.

Referring to FIG. 3, the video signal may be decoded at a time point T1, and the voltage level of the second GPIO signal may be switched in response to the video signal being decoded (VDE). As shown in FIG. 4, the voltage level is switched from a low level to a high level in response to the video signal being decoded (VDE).

Referring back to FIG. 3, the audio signal may be decoded at a time point T2, and the voltage level of the first GPIO signal may be switched in response to the audio signal being decoded (ADE). As shown in FIG. 4, the voltage level is switched from a low level to a high level in response to the audio signal being decoded (ADE).

Accordingly, during a time duration from the time point T1 to the time point T2, the first GPIO signal may be maintained at a low level and the second GPIO signal may be maintained at a high level. The time duration from the time point T1 to the time point T2 may cause a delay between the audio signal and the video signal, which may be referred to as a 'first delay time AVD1'.

According to an embodiment, when it is identified a period in which the voltage levels of the first GPIO signal and the second GPIO signal are different, that is, the first delay time, the processor may control the decoding timing (e.g. VDE, ADE) of the audio signal, the video signal, or both of them, based on a value of the first delay time. In an embodiment, when the first delay time AVD1 is identified, the processor may control the output timing of the audio, the video, or both of them based on the value of the first delay time AVD1.

According to an embodiment, the voltage levels of the first GPIO signal and the second GPIO signal may be switched in response to the data (e.g., video signal, audio signal) being output (VDO, ADO).

Further, in an embodiment, the voltage levels of the first GPIO signal and the second GPIO signal may be switched in response to receiving the response signal from other system components (e.g., a sound amplifier, a timing controller, a transceiver, etc.). In this case, the response signal may be received from the other system component in response to the processor transmitting the data to the other system component.

Referring to FIG. 4, the processor may transmit, at a time point T3, a video signal or receive a response signal for transmission of the video signal. In an embodiment, the voltage level of the second GPIO signal may be switched in response to transmitting a video signal (VDO) or receiving a response signal related to the transmission. As shown in FIG. 5, the voltage level of the second GPIO signal is switched from a low level to a high level in response to transmission of the video signal (VDO) or reception of its related response signal.

Referring to FIG. 4, the processor may transmit an audio signal or receive a response signal for transmission of the audio signal, at a time point T4. In an embodiment, the voltage level of the first GPIO signal may be switched in response to transmission of an audio signal (ADO) or reception of a response signal related to the transmission. As shown in FIG. 4, the voltage level of the first GPIO signal is switched from a low level to a high level in response to the audio signal being transmitted (ADO) or its related response signal being received.

Accordingly, for the time duration from the time point T3 to the time point T4, the first GPIO signal may be maintained at a high level and the second GPIO signal may be maintained at a low level. The time duration from the time point T3 to the time point T4 may cause a delay between the audio and the video, which may be referred to as a 'second delay time AVD2'.

According to an embodiment, when it is identified a period that the voltage levels of the first GPIO signal and the second GPIO signal are different from each other, that is, the second delay time, the processor may control the decoding timing of the audio, the video, or both of them, based on the value of the second delay time AVD2. In an embodiment, when the second delay time AVD2 is identified, the processor may control the output timing (e.g., VDO, ADO) of the audio signal, the video signal, or both of them, based on the second delay time AVD2.

Throughout the disclosure, the term 'transmission' of an audio signal (data) or a video signal (data), which implies transmission to other system component, may be understood as the audio signal (data) or the video signal (data) being 'output' by the processor (or main controller).

Referring to FIG. 5, in an embodiment, at least one processor may control the decoding timing (VDE, ADE) or the output timing (VDO, ADO), using at least some or all of the first delay time and the second delay time.

According to an embodiment, the at least one processor may control the decoding timing (VDE, ADE) and/or the output timing (VDO, ADO) of the audio, the video or both of them, so that the first and second delay times are identified within a preset threshold range, based on the first delay time AVD1 and the second delay time AVD2.

According to an embodiment, when even at least one of the first delay time AVD1 and the second delay time AVD2 is out of the preset threshold range, the at least one processor may control the decoding timing or the output timing of the video signal or the audio signal so that the delay in between the video output and the video output is identified within the preset threshold range.

According to an embodiment, when a sum of the first delay time AVD1 and the second delay time AVD2 exceeds a preset threshold range, the at least one processor may control the decoding timing (VDE, ADE) or the output timing (ADO, VDO) of the video signal or the audio signal so that the delay between the audio output and the video output is identified within the preset threshold range.

Figure 6:
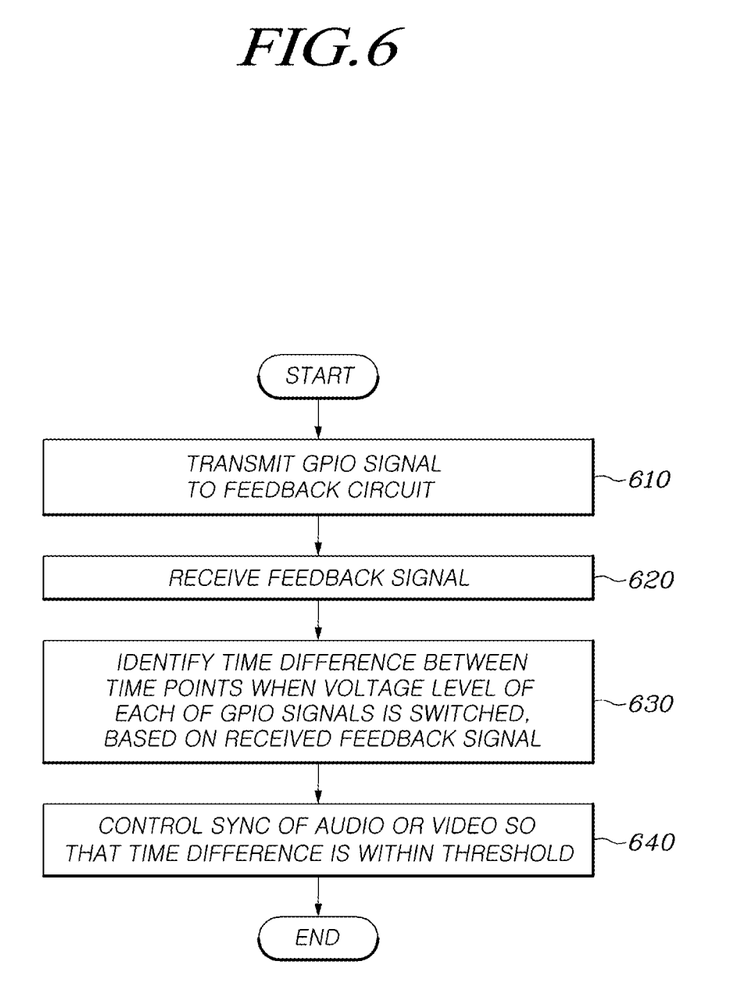
FIG. 6 is a flowchart illustrating an example operation of an example synchronization method according to various embodiments.

FIG. 6 is a flowchart illustrating an example synchronization method according to various embodiments.

According to an embodiment, at least one processor or a main controller of an electronic device may support a control method for synchronizing audio and video. At least one memory of the electronic device stores a program including instructions for executing the control method, and the processor or the main controller electrically connected to the memory can implement the control method based on the instructions.

In operation 610, the at least one processor may transmit a GPIO signal to the feedback circuitry. In an embodiment, the GPIO signal may include a first GPIO signal related to audio and a second GPIO signal related to video. In an embodiment, each GPIO signal may be transmitted to the feedback circuitry via a GPIO port provided in the processor. In an embodiment, the first GPIO signal may be transmitted to the feedback circuitry through the first GPIO port and the second GPIO signal through the second GPIO port.

In operation 620, the at least one processor may receive a response signal (e.g., a feedback signal) from the feedback circuitry. The feedback signal may include a first feedback signal and a second feedback signal, each of which feedback signals may be classified as having a different voltage level. In an embodiment, the feedback signal may be received through a third GPIO port different from the first GPIO port and the second GPIO port.

According to an embodiment, the feedback circuitry may include an XOR gate. The first GPIO port and the second GPIO port may be electrically connected to an input terminal of the XOR gate, and the third GPIO port may be electrically connected to an output of the XOR gate.

In operation 630, the at least one processor may identify a time difference (delayed time) at a time point when the voltage level of each of the GPIO signals is switched based on the feedback signal. For example, the processor may identify a time duration from a time point when the first feedback signal is received to a time point when the second feedback signal is received. The time duration from when the first feedback signal is received to when the second feedback signal is received may cause a delay in output. In an embodiment, the processor may identify the delayed time based on at least two timing points at which the voltage level of the feedback signal is switched.

In operation 640, the at least one processor may control synchronization of the audio signal and/or the video signal so that the time difference is identified within the specified threshold range. For example, the at least one processor is configured to synchronize the audio signal or the video signal such that the time difference is identified within the preset threshold range. In an embodiment, the processor may control the decoding timing of the audio or video signal, or control the output timing, such that the time difference is identified within the preset threshold range.

According to an embodiment, the processor may control the output timing or the decoding timing for the audio signal, the video signal, or both of them, when the time duration from when the first feedback signal is received to when the second feedback signal is received is out of the preset threshold range.

According to an embodiment, when the time duration from when the first feedback signal is received to when the second feedback signal is received is within the preset threshold range, the processor may maintain the output timing or the decoding timing for the audio signal, the video signal, or both of them, in its current condition.

According to an embodiment, the threshold range may be changed based on user settings. The user settings may be created or changed based on a user input to the electronic device. The user input may be obtained based on an instruction received from an input device configured as at least a part of the device (e.g., a hard key, a touch screen, etc.) or an external device capable of communicating with the device by wire or wirelessly (e.g., STB, remote controller, etc.).

Figure 7:
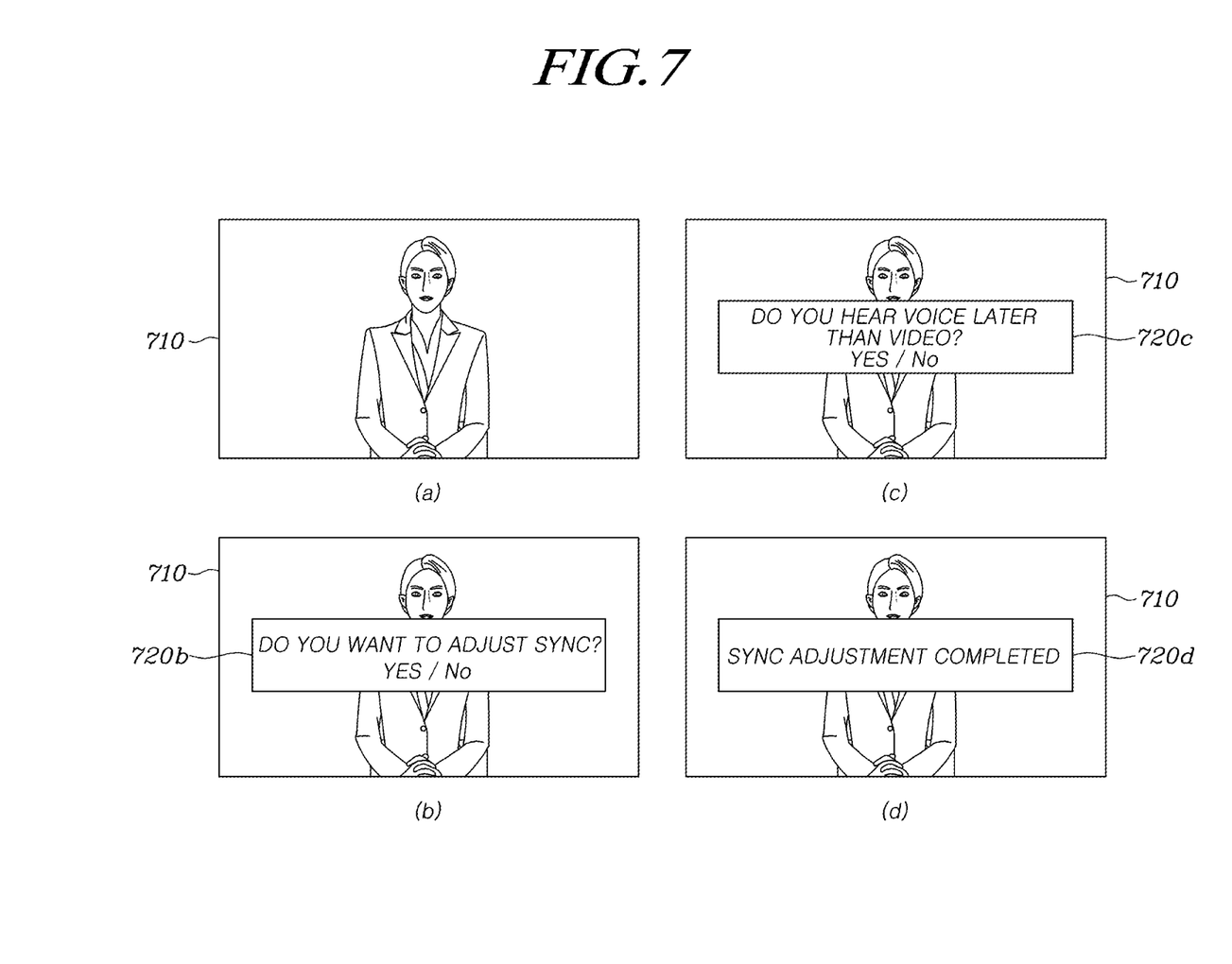
FIG. 7 is a diagram for explaining synchronization according to a machine-user interaction according to various embodiments.

FIG. 7 is an diagram illustrating example synchronization according to a machine-user interaction according to various embodiments.

According to an embodiment, an electronic device having a display module may display a user interface representation for video-audio synchronization on a display.

Referring to (a) of FIG. 7, in an embodiment, while the electronic device maintains the output of multimedia contents 710 on the display, at least one processor may at least periodically or at least continuously identify the first and second delay times between the audio and the video (see FIGS. 3, 4 and 5).

Referring to (b) of FIG. 7, in an embodiment, the at least one processor may compare the first and second delay times or a sum of the first and second delay times with a preset threshold range. The at least one processor may display a synchronization guide message 720b, when it is identified as being out of the threshold range as a result of the comparison. A synchronization guide message may include, for example, a text message such as e.g., "Do you want to adjust Sync? YES/NO".

Referring to (c) of FIG. 7, in an embodiment, the electronic device may display a message 720c for querying delay state information in response to a user input to the synchronization guide message 720b being displayed on the display. The message 720c querying delay status information may include, for example, a text message such as e.g., "Do you hear the voice later than the video? YES/NO". When a user input selecting 'YES' is received, the at least one processor may identify the audio output as being behind the video output. When an input selecting 'NO' is received, the at least one processor may identify the video output as being delayed over the audio output. According to an embodiment of the disclosure, the feedback circuitry can only measure the delay time between the audio output and the video output, and it may be difficult to identify which one of the audio output or the video output is delayed, but it may identify the delayed element based on the user's input.

Meanwhile, the user input may be input by an external device (e.g., a user terminal, a remote controller, etc.) or a separate input device (e.g., a hard key, a touch screen, etc.) provided in the electronic device, but the present disclosure is not limited thereto.

Referring to (d) of FIG. 7, according to an embodiment, the at least one processor may display a sync completion message 720d on the display in response to completion of controlling of the decoding timing or the output timing of the audio or video. The sync completion message 720d may include, for example, a text message such as e.g., "Sync adjustment completed".

The electronic device according to various embodiments disclosed herein may include various types of devices. The electronic device may include, for example, a display device, a portable communication device (e.g., a smartphone), a computing device, a portable multimedia device, a portable medical device, a camera, a wearable device, a home appliance, or the like. An electronic device according to an embodiment of the disclosure is not limited to the aforementioned devices.

Although not limited thereto, an electronic device according to an embodiment of the disclosure includes at least some of a processor, a memory, a transceiver, an audio component, a display component, and/or an input component.

According to an embodiment, at least one processor may include storage and processing circuitry to support the operation of the electronic device. The storage and processing circuitry may include storage such as a non-volatile memory (e.g., a flash memory or other electrically programmable ROM configured to form a solid state drive (SSD)), a volatile memory (e.g., a static or dynamic RAM), or the like. The processing circuitry in the processor may be used to control the operation of an electronic device. The processing circuitry may include or be configured with one or more microprocessor(s), microcontroller(s), digital signal processor(s), baseband processor(s), power management section(s), audio chip(s), application-specific integrated circuit(s) or the like. The transceiver and memory described below may be provided as a functional element that perform a specific function or operation as at least a part of the processor as an example of the processor, or may be provided as a separate hardware component, as an entity performing an independent function or operation.

According to an embodiment, one or more memory may include memory areas for one or more processors to store variables used in protocols, configurations, controls, and other functions of the device, corresponding to or including any of the methods and/or procedures illustrated in this disclosure. Furthermore, the memory may include a non-volatile memory, a volatile memory, or a combination thereof. Moreover, the memory may interface with a memory slot that allows one or more formats of removable-type memory cards of (e.g., SD card, memory stick, compact flash, etc.) to be inserted and removed.

According to an embodiment, the transceiver may include a wireless communication module or an RF module. The wireless communication module may include, for example, Wi-Fi, BT, GPS or NFC. For example, the wireless communication module may provide a wireless communication function using a radio frequency. Additionally or alternatively, the wireless communication module may include a network interface or a modem for connecting the device 100 to a network (e.g., Internet, LAN, WAN, telecommunication network, cellular network, satellite network, POTS or 5G network, or the like). The RF module may be responsible for transmitting and receiving data, for example, transmitting and receiving RF signals or called electronic signals. For example, the RF module may include a power amplification module (PAM), a frequency filter, a low-noise amplifier (LNA), or the like. Further, the RF module may further include components for transmitting and receiving electromagnetic waves over a free space in wireless communication, for example, conductors or wires.

According to an embodiment, the audio component is an electronic module or an electronic device including various circuitry for outputting sound signals such as audio or music of media contents. According to an embodiment, the audio component may receive audio data from a peripheral device interface. The received audio data is converted into electrical signals and transmitted to a speaker. The speaker converts the electrical signals into sound waves that humans can hear and outputs them. The audio component may include, for example, a receiver, a speaker, a buzzer, etc., but it is not limited thereto.

According to an embodiment, the display component is an electronic module or an electronic device including various display circuitry and/or a display for outputting a video or image. The display component includes, for example, a single display panel or a multiple display panel. In the case of having a single display panel, the device may output one display screen. In the case of having the multiple display panel, the device may output an integrated screen in the form of a combination of outputs of two or more display panels. Meanwhile, a plurality of windows may be included in one output screen even when a single display panel is provided, so one output is not limited to only one window. In an embodiment, the multiple display panel may be provided in, for example, a TV, a monitor, an MR device, an AR device, or a VR device. In an example of implementation, when it is provided in an MR device, an AR device, or a VR device, the multiple-display panel may provide MR, AR, or VR contents to each eye of a viewer.

According to an embodiment, one or more display components are configured to present a user interface. In an example of implementation, the one or more display components may include or correspond to, e.g., holographic, Digital Light Processing (DLP), Liquid Crystal Display (LCD), Liquid Crystal on Silicon (LcoS), Organic Light Emitting Transistor (OLET), Organic Light Emitting Diode (OLED, Surface-Conduction Electron-Emitter Display (SED), Field Emission Display (FED), Quantum Dot Light Emitting Diode (QD-LED), Micro-Electro-Mechanical System (MEMS), or similar display types. In an example implementation, one or more display components 150 may include or correspond to a diffractive, reflective, polarized, or holographic type of waveguide display.

According to an embodiment, the input component includes various input circuitry including a user input component for receiving a user's input. The user input component is an electronic module or an electronic device for receiving an input from a user. The user input component may include, for example, a keypad, a button, a touch pad, or a touch screen, but the disclosure is not limited thereto. In an embodiment, the user may input a control command related to a device according to an embodiment of the disclosure using a remote control device.

According to an embodiment, the input component includes an A/V input unit for receiving an A/V input. The A/V input unit may include various circuitry and provide a video or audio signal from an external device to the device according to an embodiment of the disclosure. The A/V input unit may include, for example, a USB terminal, a composite video banking sync (CVBS) terminal, a component terminal, an S-video terminal (analog), a digital visual interface (DVI) terminal, a high definition multimedia interface (HDMI) terminal, an RGB terminal, a D-SUB terminal, or the like, but the disclosure is not limited thereto.

According to an embodiment, one or more processors, one or more memories, one or more transceivers, one or more audio components, one or more display components, and/or one or more input components may be respectively interconnected via one or more buses. In an embodiment, one or more buses include a circuitry interconnects and/or controls communications between system components.

The various embodiments and the terms used herein are not intended to limit the technical features described herein to specific embodiments and should be understood to include various modifications, equivalents, or substitutes of the embodiment. For example, an element expressed in a singular form should be understood as including a plurality of elements unless the context explicitly dictates only a singular form. It should be appreciated that the term 'and/or' used herein encompasses any and all possible combinations of one or more of the listed items. The terms such as 'comprise', 'include', 'have', or 'consist of' used in the disclosure are only intended to designate that there are features, components, parts, or a combination thereof described in the disclosure, and are not intended to exclude a possibility of the presence or addition of one or more other features, components, parts, or a combination thereof, using these terms. In this disclosure, each of the phrases such as "A or B", "at least one of A and B", "at least one of A or B", "A, B or C", "at least one of A, B and C", and "at least one of A, B, or C" may include any one of the items enumerated together in a corresponding one of the phrases, or all possible combinations thereof. The terms such as 'the first', 'the second', 'first', or 'second' may be used simply to distinguish a corresponding component from another corresponding component, and do not limit the corresponding components in view of other aspect (e.g., importance or order).

The terms such as e.g., 'module' or 'unit' used in various embodiments of the present disclosure may include a unit implemented in hardware, software, or firmware, or any combination thereof, and be used interchangeably with terms such as e.g., logic, logic block, part, component, or circuitry, for example. The module or unit may be a minimum unit or a part of the integrally configured component or the component that performs one or more functions. For example, according to an embodiment, such a 'module' or 'unit' may be implemented in the form of an application-specific integrated circuit (ASIC).

The term "in case ~" used in various embodiments of the disclosure may be interpreted to refer, for example, to "when to ~", "when it is ~", "in response to determining ~", or "in response to detecting ~", depending on the context. Similarly, the expressions such as e.g., "when it is determined to be ~" or "when it is detected to be ~" may be interpreted to refer, for example, to "when determining ~", "in response to determining ~", "when detecting ~" or "in response to detecting ~", depending on the context.

The program executed by the electronic device 100 or 200 described herein may be implemented as a hardware component, a software component, and/or a combination of the hardware component and the software component. The program may be performed by any system capable of executing computer-readable instructions.

The software may include computer programs, codes, instructions, or a combination of one or more of these, and may configure a processing unit to operate as desired or command the processing unit either independently or collectively. The software may be implemented as a computer program including instructions stored in a computer-readable storage medium. The computer-readable recording medium may include, for example, a magnetic storage medium (e.g., floppy disk, hard disk, etc.), a solid-state storage medium (e.g., read-only memory (ROM), random-access memory (RAM)), an optical-readable storage medium (e.g., CD-ROM, Digital Versatile Disc (DVD)) or the like. The computer program may be distributed (e.g., downloaded or uploaded) by online via an application store (e.g., PlayStore™), or between two user devices (e.g., smartphones) directly. In the case of online distribution, at least part of the computer program product may be at least temporarily stored or temporarily created in a storage medium that can be read by an apparatus such as e.g., a manufacturer's server, an application store server, or a relay server memory.

According to various embodiments of the disclosure, each component (e.g., a module or a program) of the above-described components may include a single entity or multiple entities, and some of the multiple entities may be separately disposed in different components. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device configured to synchronize audio and video outputs, comprising:
    memory;
    at least one display component including display circuitry;
    at least one audio component including audio circuitry; and
    at least one processor electrically connected to at least some of the memory, the at least one display component, and the at least one audio component,
    wherein the at least one processor is electrically connected to feedback circuitry and configured to transmit a first signal related to video and a second signal related to audio to the feedback circuitry,
    wherein the at least one processor is configured to:
    obtain, based on a feedback signal received from the feedback circuitry, a time difference between a first time point at which a voltage level of the first signal is switched and a second time point at which a voltage level of the second signal is switched, and
    control an output timing of the audio or the video based on the time difference.

2. The electronic device of claim 1, wherein the feedback circuitry includes an XOR gate electrically connected to at least one general purpose input/output (GPIO) port of the at least one processor.

3. The electronic device of claim 2, wherein the first signal is transmitted to the feedback circuitry through a first GPIO port,
    wherein the second signal is transmitted to the feedback circuitry through a second GPIO port, and
    wherein the feedback signal is received from the feedback circuitry through a third GPIO port.

4. The electronic device of claim 2, wherein a voltage level of the feedback signal is determined based on voltage levels of the first signal and the second signal.

5. The electronic device of claim 2, wherein a voltage level of the feedback signal is switched at the first time point at which the voltage level of the first signal is switched and at the second time point at which the voltage level of the second signal is switched.

6. The electronic device of claim 1, wherein the voltage level of the first signal is switched by the at least one processor at a time point at which a video signal is decoded or at a time point at which the video signal is transmitted to a timing controller or the at least one display component.

7. The electronic device of claim 1, wherein the voltage level of the second signal is switched by the at least one processor at a time point at which an audio signal is decoded or at a time point at which the audio signal is transmitted to a sound amplifier or the at least one audio component.

8. The electronic device of claim 1, wherein the time difference includes a first delay time between time points at which a video signal and an audio signal are decoded, and a second delay time between time points at which the video signal and the audio signal are transmitted to another system component.

9. The electronic device of claim 8, wherein the at least one processor is configured to:
    control an output timing of audio or video based on at least one of the first delay time and the second delay time being out of a specified threshold range, such that at least one of the first delay time and the second delay time is identified within the specified threshold range.

10. The electronic device of claim 8, wherein the at least one processor is configured to:
    control an output timing of audio or video based on the second delay time being out of a specified threshold range, such that at least one of the first delay time and the second delay time is identified within the specified threshold range.

11. An electronic device configured to synchronize audio and video outputs, comprising:
    at least one display component including display circuitry and a timing controller electrically connected to the at least display component;
    at least one audio component including audio circuitry and a sound amplifier electrically connected to the at least audio component; and
    processing circuitry electrically connected to at least some of the timing controller and the sound amplifier,
    wherein the processing circuitry includes a first GPIO port electrically connected to a feedback circuitry and configured to transmit a first signal related to video to the feedback circuitry, a second GPIO port electrically connected to the feedback circuitry and configured to transmit a second signal related to audio to the feedback circuitry, and a third GPIO port configured to receive a feedback signal from the feedback circuitry.

12. The electronic device of claim 11, wherein the processing circuitry is configured to:
    obtain a time difference between a first time point at which a voltage level of the first signal is switched and a second time point at which a voltage level of the second signal is switched, based on the feedback signal received from the feedback circuitry, and
    control an output timing of the audio or the video based on the time difference.

13. The electronic device of claim 11, wherein a voltage level of the first signal is configured to be switched by the processing circuitry at a time point at which a video signal is decoded or at a time point at which the video signal is transmitted to the timing controller or the display component.

14. The electronic device of claim 11, wherein a voltage level of the second signal is configured to be switched by the processing circuitry at a time point at which an audio signal is decoded or at a time point at which the audio signal is transmitted to the sound amplifier or the audio component.

15. The electronic device of claim 11, wherein the feedback circuitry includes an XOR gate electrically connected to the first, second and third GPIO ports.

* * * * *